United States Patent
Noguchi

(10) Patent No.: US 9,534,315 B2
(45) Date of Patent: Jan. 3, 2017

(54) DIAMOND PRODUCING METHOD AND DC PLASMA ENHANCED CVD APPARATUS

(71) Applicant: Shin-Estu Chemical Co., Ltd., Tokyo (JP)

(72) Inventor: Hitoshi Noguchi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 663 days.

(21) Appl. No.: 13/954,669

(22) Filed: Jul. 30, 2013

(65) Prior Publication Data
US 2014/0041574 A1    Feb. 13, 2014

(30) Foreign Application Priority Data
Aug. 7, 2012    (JP) ................. 2012-174619

(51) Int. Cl.
| | |
|---|---|
| C30B 25/16 | (2006.01) |
| C23C 16/517 | (2006.01) |
| C23C 16/27 | (2006.01) |
| C23C 16/515 | (2006.01) |
| C30B 25/10 | (2006.01) |

(Continued)

(52) U.S. Cl.
CPC ............ *C30B 25/16* (2013.01); *C23C 16/272* (2013.01); *C23C 16/515* (2013.01); *C23C 16/517* (2013.01); *C30B 25/105* (2013.01); *C30B 25/183* (2013.01); *C30B 29/04* (2013.01)

(58) Field of Classification Search
CPC .... C23C 16/272; C23C 16/515; C23C 16/517; C30B 25/105; C30B 25/16; C30B 25/183; C30B 29/04; F22B 11/02
See application file for complete search history.

(56) References Cited

U.S. PATENT DOCUMENTS

| | | | |
|---|---|---|---|
| 7,628,856 B2 | 12/2009 | Sawabe et al. | |
| 2010/0178730 A1 | 7/2010 | Noguchi | |

(Continued)

FOREIGN PATENT DOCUMENTS

| | | | |
|---|---|---|---|
| JP | 6-280030 A | | 10/1994 |
| JP | 06280030 A | * | 10/1994 |

(Continued)

OTHER PUBLICATIONS

Ohtsuka et al., "Epitaxial Growth of Diamond on Iridium" Jpn. J. Appl. Phys., vol. 35, Part 2, No. 8B, Aug. 15, 1996, pp. L1072-L1074.

(Continued)

*Primary Examiner* — Michael Kornakov
*Assistant Examiner* — Hua Qi
(74) *Attorney, Agent, or Firm* — Birch, Stewart, Kolasch & Birch, LLP

(57) ABSTRACT

Diamond is grown on a substrate (S) from a mixture of a carbon-containing gas and hydrogen gas, by a DC plasma enhanced CVD process of applying a DC voltage between a stage electrode (12) for holding the substrate (S) and a voltage-applying electrode (13). During the step of growing diamond by applying a DC voltage, a single pulse voltage of opposite polarity to the DC voltage for diamond growth is applied between the stage electrode and the voltage-applying electrode at a predetermined timing. Diamond of quality is produced at a stable growth rate.

5 Claims, 1 Drawing Sheet

(51) Int. Cl.
    *C30B 25/18*    (2006.01)
    *C30B 29/04*    (2006.01)

(56) References Cited

U.S. PATENT DOCUMENTS

2011/0045208 A1*  2/2011  Ohtake ................ C23C 16/042
                                                    427/577
2011/0084285 A1    4/2011  Noguchi

FOREIGN PATENT DOCUMENTS

| JP | 2007-238377 A | 9/2007 |
| JP | 2008-144249 A | 6/2008 |
| JP | 2010-159465 A | 7/2010 |
| JP | 2011-84411 A  | 4/2011 |

OTHER PUBLICATIONS

Shintani, "Growth of highly (111)-oriented, highly coalesced diamond films on platinum (111) surface: A possibility of heteroepitaxy", J. Mater. Res., vol. 11, No. 12, Dec. 1996, pp. 2955-2956.

Office Action issued Jun. 2, 2015, in Japanese Patent Application No. 2012-174619.

Maeda et al., "Fabrication of epitaxial diamond film on iridium substrate of 1 inch diameter", NDF-Dai. Symp., 2004, pp. 10-11.

* cited by examiner

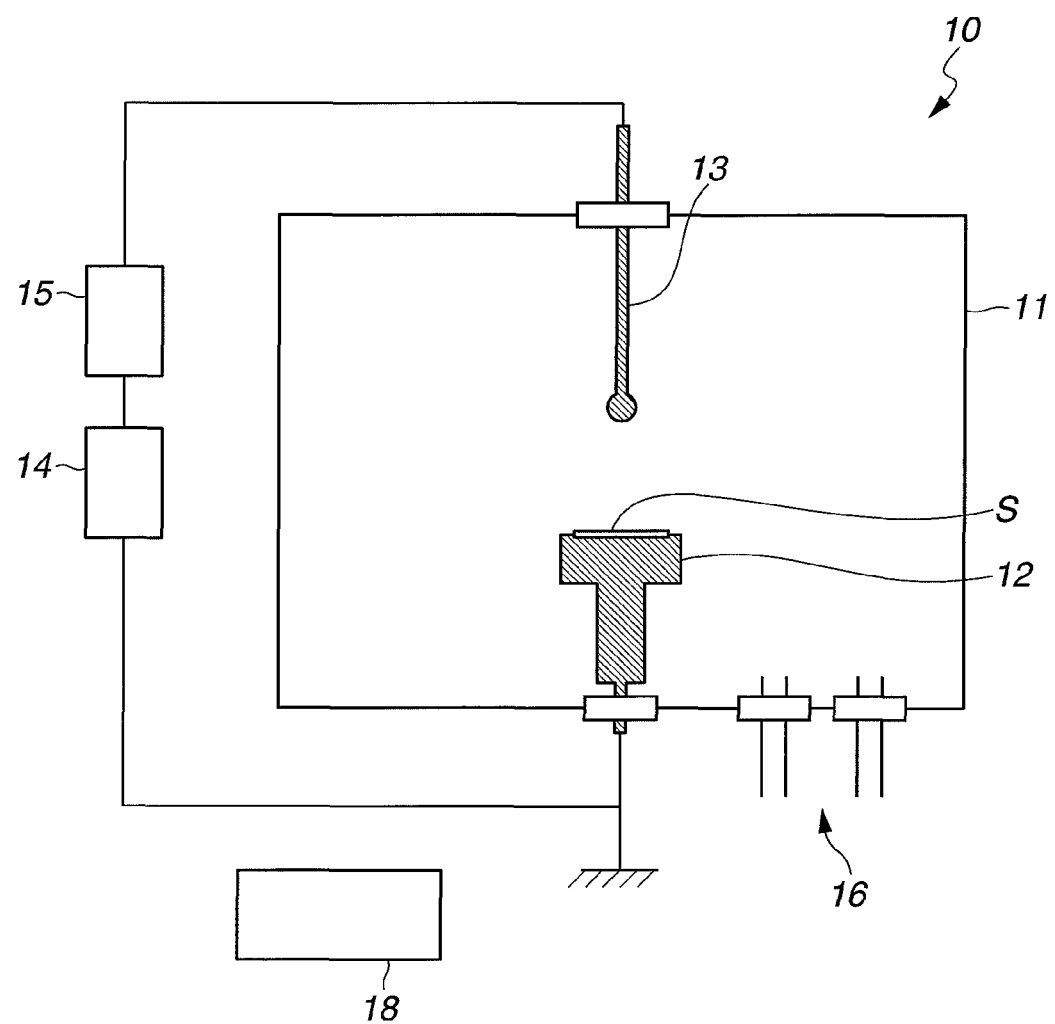

DIAMOND PRODUCING METHOD AND DC PLASMA ENHANCED CVD APPARATUS

CROSS-REFERENCE TO RELATED APPLICATION

This non-provisional application claims priority under 35 U.S.C. §119(a) on Patent Application No. 2012-174619 filed in Japan on Aug. 7, 2012, the entire contents of which are hereby incorporated by reference.

TECHNICAL FIELD

This invention relates to a method for producing diamond and a direct current plasma enhanced CVD apparatus for diamond production.

BACKGROUND ART

Diamond has a wide bandgap of 5.47 eV and a very high dielectric breakdown electric field strength of 10 MV/cm. Its thermal conductivity is the highest among materials. Thus diamond may be advantageously used to construct high-power electronic devices.

Furthermore, diamond is the most advantageous as a high-speed electronic device among semiconductors because of high drift mobility and Johnson's figure of merit. The Johnson's figure of merit indicates a velocity of carrier migration in device, with a higher figure of merit corresponding to a higher migration velocity. For this reason, diamond is believed to be the ultimate semiconductor suitable for high-frequency/high-power electronic devices.

Attention is paid on multilayer laminates including a substrate overlaid with a diamond film or the like. Most single crystal diamonds currently used for the fabrication of diamond semiconductor are type Ib diamonds synthesized by the high pressure method. Since type Ib diamonds contain more nitrogen impurity and can only be produced in a size of the order of 5 mm squares, they find few applications.

By contrast, the chemical vapor deposition (CVD) method has the advantage that polycrystalline diamond can be produced as a diamond film of a large area having a diameter of about 6 inches (150 mm) and of high purity. The CVD method, however, is difficult to synthesize single crystal diamond, which is suitable for most electronic devices. This is because single crystal silicon is typically used as substrate in the art. Since silicon and diamond are largely different in lattice constant (a mismatch of 52.6%), it is very difficult to heteroepitaxially grow diamond on silicon substrates.

Efforts were made to overcome the problem. For example, Non-Patent Documents 1 and 2 report that a diamond film is effectively formed on an undercoat of platinum (Pt) or iridium (Ir) by the CVD method. At the present, the research on iridium has been most advanced. The method involves the steps of providing a substrate of single crystal MgO, heteroepitaxially growing an iridium film thereon, pretreating the Ir film surface, i.e., effecting bias treatment with hydrogen-diluted methane gas by a DC plasma enhanced CVD method, and depositing a diamond film on the pretreated iridium film. There are obtained diamonds having a size of submicron order at the early stage to several millimeters at the present. The thickness of a diamond portion is several microns to about 100 microns ($\mu$m). In Non-Patent Document 3, for example, deposition is continued for 8 hours until a diamond film of about 100 $\mu$m thick is obtained.

However, when diamond deposition is continued for several hours or more in a conventional DC plasma enhanced CVD apparatus, electric charge builds up on the substrate surface because the deposited diamond is an insulator. A foreign substance is also formed on the surface of the counter electrode, causing charge buildup. Such charge buildup functions to retard the growth rate of diamond and allows for frequent occurrence of sparks, causing to introduce defects and fissures in diamond.

CITATION LIST

Patent Document 1: JP-A 2011-084411 (US 20110084285)
Patent Document 2: JP-A 2010-159465 (US 20100178730)
Non-Patent Document 1: Y. Shintani, J. Mater. Res., 11, 2955 (1996)
Non-Patent Document 2: K. Ohtsuka, Jpn. J. Appl. Phys., 35, L1072 (1996)
Non-Patent Document 3: S. Maeda, et al, the 18th diamond symposium lecture summary, pp. 10-11 (2004)

SUMMARY OF INVENTION

An object of the invention is to provide a method for producing diamond of quality while maintaining a stable rate of diamond growth, and a DC plasma enhanced CVD apparatus for diamond production.

In one aspect, the invention provides a method for producing diamond, comprising the step of growing diamond on a substrate from a gas mixture comprising at least a carbon-containing gas and hydrogen gas, by a DC plasma enhanced CVD process of applying a DC voltage between a stage electrode for holding the substrate and a voltage-applying electrode. During the step of growing diamond by applying a DC voltage, a single pulse voltage of opposite polarity to the DC voltage for diamond growth is applied between the stage electrode and the voltage-applying electrode at a predetermined timing.

In a preferred embodiment, during the step of applying a DC voltage for diamond growth, the stage electrode serves as the anode and the voltage-applying electrode serves as the cathode.

In a preferred embodiment, the single pulse voltage of opposite polarity is applied when a charging-up voltage between the stage electrode and the voltage-applying electrode reaches at least ⅓ of the DC voltage for diamond growth.

In a preferred embodiment, the single pulse voltage of opposite polarity is applied at a constant periodicity of up to 1 pulse per 100 $\mu$s.

In a preferred embodiment, the single pulse voltage of opposite polarity has a value which corresponds to the DC voltage for diamond growth by a factor of 1/30 to 1.

In another aspect, the invention provides a DC plasma enhanced CVD apparatus comprising a vacuum chamber, a stage electrode for holding a substrate and a voltage-applying electrode disposed in the vacuum chamber in combination, a DC power supply for applying a DC voltage between the stage electrode and the voltage-applying electrode, a pulse voltage stacking unit for stacking a pulse voltage on the output voltage of the DC power supply, and feed means for feeding a reactant gas into the vacuum chamber, wherein diamond is grown on the substrate by applying a DC voltage between the stage electrode and the voltage-applying electrode, and voltage control is carried out at a predetermined timing during the diamond growth such that a single pulse voltage of opposite polarity to the DC voltage for diamond growth is applied between the stage electrode and the voltage-applying electrode.

Advantageous Effects of Invention

During the step of growing diamond by applying a DC voltage, a single pulse voltage of opposite polarity to the DC voltage for diamond growth is applied between the stage electrode and the voltage-applying electrode at a predetermined timing, for thereby inhibiting any charge buildup on the substrate. This minimizes a reduction of the growth rate of diamond due to charge buildup between the electrodes, and eliminates defects in diamond which are otherwise caused by sparking due to charge buildup. Thus diamond of quality can be produced at a high speed.

BRIEF DESCRIPTION OF DRAWINGS

The only FIGURE, FIG. 1 is a schematic view of one exemplary DC plasma enhanced CVD apparatus for diamond production according to the invention.

DESCRIPTION OF PREFERRED EMBODIMENTS

Some embodiments of the invention are described below although the invention is not limited thereto.

The invention relies on the DC plasma enhanced chemical vapor deposition (hereinafter referred to as "CVD" or "PECVD") process. The plasma enhanced mode of CVD is by providing a reactant gas between two electrodes, applying a direct current (DC) voltage between two electrodes to create a plasma of the reactant gas, and forming a deposit on a substrate on one electrode. The DC plasma enhanced CVD process is characterized by an apparatus of simple structure and growth over a large area at a high rate.

However, as discussed above, problems arise when diamond is grown by the prior art DC plasma enhanced CVD process. Because of insulating nature, as the thickness of diamond increases, more charge builds up on the substrate, reducing the growth rate of diamond. During the progress of the CVD process, an insulating deposit is also formed on the surface of the counter (voltage applying) electrode, causing charge buildup to retard the growth rate of diamond. Charge buildup on the substrate surface and electrode surface may sometimes trigger sparks, causing to introduce defects or fissures in the diamond film.

Making investigations to overcome the problems, the inventors have found that if a single pulse voltage of opposite polarity is applied between the stage electrode and the voltage applying electrode at a predetermined timing sufficient to offset the charge buildup before a drop of growth rate or spark generation occurs due to charge buildup, then it becomes possible to minimize a drop of growth rate of diamond, to suppress spark generation, and to eliminate defects. As a result, diamond of quality can be produced at a high speed.

Specifically, the invention is directed to a method for producing diamond, comprising the step of growing diamond on a substrate from a gas mixture comprising at least a carbon-containing gas and hydrogen gas, by a DC plasma enhanced CVD process of applying a DC voltage between a stage electrode for holding the substrate and a voltage-applying electrode. The invention is characterized in that during the step of growing diamond by applying a DC voltage, a single pulse voltage of opposite polarity to the DC voltage for diamond growth is applied between the stage electrode and the voltage-applying electrode at a predetermined timing.

According to the invention, diamond is produced using a PECVD apparatus as shown in FIG. 1, for example.

FIG. 1 schematically illustrates, partly in cross section, one exemplary DC plasma enhanced CVD apparatus for diamond production according to the invention. The PECVD apparatus 10 includes a vacuum chamber 11, a stage electrode 12 for holding a substrate S, a voltage-applying electrode 13, the electrodes 12 and 13 being disposed in the chamber 11 in combination, a DC power supply 14 for applying a DC voltage between the stage electrode 12 and the voltage-applying electrode 13, a pulse voltage stacking unit 15 for stacking a pulse voltage on the output voltage of the DC power supply 14, a feeder 16 for feeding a reactant gas into the chamber 11, and a controller 18 for controlling the foregoing components, i.e., for governing the overall apparatus.

The chamber 11 is a vacuum container of stainless steel or the like which may be tightly sealed. The stage electrode 12 and the voltage-applying electrode 13 are inserted into the chamber 11 via insulating gaskets. The interior of chamber 11 is evacuated to vacuum by a vacuum pumping means (not shown) such as vacuum pump.

The stage electrode 12 is disposed on the bottom side of chamber 11 for holding the substrate S thereon. The voltage-applying electrode 13 is disposed on the top side of chamber 11 and opposed to the stage electrode 12. Notably, the electrodes 12 and 13 are made of a refractory metal to withstand the high temperature of plasma discharge such as tantalum (Ta), molybdenum (Mo) or tungsten (W).

The DC power supply 14 serves to apply a DC voltage between the stage electrode 12 and the voltage-applying electrode 13 to create a plasma for diamond growth. At this point, the stage electrode 12 is at ground potential (earth), the stage electrode 12 is made the anode and the voltage-applying electrode 13 made the cathode.

The pulse voltage stacking unit 15 functions to stack a positive voltage pulse of an extremely short duration on the negative DC voltage produced by the DC power supply 14. Consequently, a single pulse voltage of opposite polarity to the DC voltage for diamond growth is applied between the stage electrode 12 and the voltage-applying electrode 13.

The feeder 16 feeds a reactant gas necessary for diamond growth into the chamber 11, for example, a gas mixture comprising at least a carbon-containing gas and hydrogen gas, typically a mixture of methane and hydrogen gases. During diamond growth, the pressure within the chamber 11 is controlled to the desired value by detecting the pressure by a pressure sensor (not shown) mounted within the chamber 11, and controlling the opening of an outlet valve (not shown) in accordance with the detected pressure for adjusting the flow rate of outgoing gas.

The controller 18 is to control the operation of individual components of overall PECVD apparatus 10, for example, to control the vacuum pumping of the chamber 11 by a vacuum pump, to control the power supply of the DC power supply 14 and pulse voltage stacking unit 15, and to control the reactant gas feed from the feeder 16.

In accordance with the method of the invention, diamond is produced using the DC plasma enhanced CVD apparatus 10 constructed as above. Specifically, diamond growth includes the following steps.

Step 1 is to mount a substrate S on the stage electrode 12. The substrate S used herein is not particularly limited as long as single crystal diamond can be deposited thereon by the PECVD process. Included are a substrate of single crystal MgO having a single crystal Ir layer heteroepitaxially grown thereon, a HPHT single crystal diamond substrate, and a single crystal SiC substrate having a single crystal Ir or Rh layer heteroepitaxially grown thereon. If desired, the substrate S may be previously bias treated. The bias treatment may be effected by the method of JP-A 2007-238377, for example, specifically by treating the substrate S surface with a DC discharge, with the substrate-holding electrode made the cathode, for forming diamond growth nuclei on the substrate surface.

Step 2 is to operate a vacuum pump to evacuate the chamber 11 interior to a vacuum, for example, of $1\times10^{-3}$ Torr or lower.

Step 3 is to feed a reactant gas from the feeder 16 to the chamber 11 and to adjust the gas to the desired pressure. The reactant gas used herein is a mixture of at least carbon-containing gas and hydrogen gas, for example, methane gas diluted with hydrogen gas.

Step 4 is to apply a DC voltage from the DC power supply 14 between the stage electrode 12 and the voltage-applying electrode 13 to create a plasma in the chamber 11, for letting diamond grow on the substrate S. At this point, the stage electrode 12 is set at ground potential (earth) and made the anode, while the voltage applying electrode 13 receives a voltage having a negative polarity potential relative to the stage electrode 12 and is made the cathode. The DC voltage applied between the stage electrode 12 and the voltage applying electrode 13 for diamond growth (referred to as "DC voltage for diamond growth") is of the order of −1,000 volts to −400 volts, for example, sufficient to create a plasma with which the reactant gas is decomposed.

In Step 5, a single pulse voltage of opposite polarity to the DC voltage for diamond growth is applied between the stage electrode 12 and the voltage-applying electrode 13 at a predetermined timing during Step 4 of diamond growth. That is, while the DC voltage for diamond growth is continuously applied, the pulse voltage stacking unit 15 stacks a pulse voltage on the output voltage of the DC power supply 14. Then a single pulse voltage (predetermined DC voltage) of opposite polarity to the DC voltage for diamond growth is applied between the stage electrode 12 and the voltage-applying electrode 13 for a short duration and at a predetermined timing. This eliminates the problem of charge buildup between the stage electrode 12 and the voltage-applying electrode 13 during diamond growth.

The phrase that "a single pulse voltage of opposite polarity to the DC voltage for diamond growth is applied" means that during continuous application of the DC voltage for diamond growth, a pulse of DC voltage (or reverse voltage pulse) is instantaneously applied such that the stage electrode 12 is made the cathode and the voltage-applying electrode 13 is made the anode (and ground). Application of pulse voltage is under such conditions as not to degrade the quality of growing diamond film.

Preferably the timing of applying the reverse voltage pulse is when the charging-up voltage between the stage electrode 12 and the voltage-applying electrode 13 reaches at least one third of the DC voltage V for diamond growth (i.e., $\geq V/3$), provided that control is made by the current-to-voltage relationship necessary to maintain an electric discharge for diamond growth. This effectively offsets the charge buildup between the stage electrode 12 and the voltage-applying electrode 13. If the pulse is applied when the charging-up voltage is less than one third of the DC voltage V for diamond growth (i.e., $<V/3$), the charge buildup is little improved, and diamond growth is rather retarded.

With respect to the timing of applying the reverse voltage pulse, reverse voltage pulses may be periodically applied during continuous application of DC voltage for diamond growth, for thereby preventing the charge buildup. In this embodiment, the periodicity T ($=1/f$) is up to 1 pulse per 100 μs, i.e., $f\leq 10$ kHz. At a periodicity of more than 1 pulse per 100 μs (i.e., $f>10$ kHz), properties of the resulting film include inherent properties of a film resulting from the DC plasma enhanced CVD process plus properties of a film resulting from the high-frequency or AC plasma enhanced CVD process, with the crystallinity of diamond being degraded.

Also preferably, the magnitude of reverse voltage pulse corresponds to the DC voltage (potential V) for diamond growth by a factor of 1/30 to 1 (that is, reverse voltage pulse's potential=−V to −V/30). If the magnitude of reverse voltage pulse is less than 1/30 of the DC voltage V for diamond growth, the effect of offsetting charge buildup may be lessened. If the magnitude of reverse voltage pulse exceeds the DC voltage V for diamond growth, a plasma discharge due to DC voltage of opposite polarity may generate, with the quality of diamond film being degraded.

Step 6 is to separate diamond from the substrate S, yielding a diamond substrate. Separation may be performed by wet etching, mechanical grinding or otherwise. Step 6 is optional. Without separation of diamond, the substrate S having diamond grown thereon may be used as a multilayer substrate.

According to the production method mentioned above, diamond is grown while offsetting any charge buildup between the stage electrode 12 and the voltage-applying electrode 13. This inhibits spark generation, while maintaining a stable growth rate. Therefore defect-free diamond of quality can be produced at a high speed.

EXAMPLE

Examples are given below by way of illustration and not by way of limitation.

Example 1

Diamond was produced by the method of the invention under the following conditions.

Preparation of Substrate

A double-side lapped substrate of single crystal MgO having a diameter of 25.0 mm, a thickness of 1.00 mm, and orientation (100) was prepared. On this MgO substrate, an iridium (Ir) film was heteroepitaxially grown. Specifically, sputtering was carried out by the RF magnetron sputtering method using an Ir target, Ar gas $6\times10^{-2}$ Torr and a substrate temperature of 700° C., until the single crystal Ir film reached a thickness of 1.5 μm.

To provide for electric conduction during subsequent bias treatment and DC plasma enhanced CVD treatment, an Ir film of 1.5 μm thick was deposited on the back surface of the substrate under the same conditions as above except a substrate temperature of 100° C.

Bias Treatment

Bias treatment was carried out on the surface of single crystal Ir film on the substrate for forming diamond nuclei. First, the substrate was set above the negative voltage-applying electrode (or cathode) of a bias treatment system, which was vacuum pumped. Once the substrate was heated at 600° C., 3 vol % hydrogen-diluted methane gas was fed into the system under a pressure of 160 hPa (120 Torr). Bias treatment was carried out by applying DC voltage between electrodes to conduct a predetermined DC flow.

Diamond Growth

Next, on the bias treated substrate, single crystal diamond was heteroepitaxially grown by the DC plasma enhanced CVD process using the PECVD apparatus 10 shown in FIG. 1. Specifically, the substrate was rested on the stage electrode 12, the chamber 11 was pumped to vacuum, the substrate was heated at a temperature of 900° C., 4 vol % hydrogen-diluted methane gas was fed as reactant gas, and the pressure in chamber 11 was adjusted to 160 hPa (120 Torr).

Next, a DC voltage (−500 volts) for diamond growth was applied between the stage electrode 12 which was grounded and made the anode and the voltage-applying electrode 13 which was made the cathode, to carry out diamond growth for 15 hours (first growth). Under the predetermined reverse voltage pulse applying condition, that is, when the charging-up voltage reached half the DC voltage (i.e., potential −V/2) during diamond growth, the pulse voltage stacking unit 15 was operated to stack a single pulse voltage of opposite polarity to the DC voltage for diamond growth on the output voltage of the DC power supply 14, for thereby applying a reverse voltage pulse having a voltage V/10 between the stage electrode 12 and the voltage-applying electrode 13 for a duration of 5 µs.

At the end of first growth, the product was taken out of the chamber 11. It was found that diamond was grown to a thickness of 75 µm (growth rate of 5 µm/hr).

Thereafter, the DC plasma enhanced CVD process using the PECVD apparatus 10 was repeated under the same conditions as in the first growth, to carry out diamond growth for 5 hours (second growth). At the end of second growth, the product was taken out of the chamber 11. It was found that the diamond film had a thickness of 150 µm (growth rate of 5 µm/hr). A high growth rate was maintained in both the first and second growth steps.

The resulting single crystal diamond substrate was analyzed by Raman spectrometry, X-ray rocking curve, cross-sectional transmission electron microscopy (TEM), and cathodoluminescence (CL). It was found to have good crystallinity and be free of defects.

Example 2

Diamond was produced under the same conditions as in Example 1 except that among the voltage applying conditions for diamond growth, the reverse voltage pulse applying condition was changed as follows.

Reverse Voltage Pulse Applying Condition

Every growth time of 250 µs (i.e., f=4 kHz) during diamond growth, the pulse voltage stacking unit 15 was operated to stack a single pulse voltage of opposite polarity to the DC voltage for diamond growth on the output voltage (potential V) of the DC power supply 14, for thereby applying a reverse voltage pulse having a voltage V/20 (potential −V/20) between the stage electrode 12 and the voltage-applying electrode 13 just for a duration of 5 µs.

At the end of first growth, the product was taken out of the chamber 11. It was found that diamond was grown to a thickness of 75 µm (growth rate of 5 µm/hr).

Thereafter, the DC plasma enhanced CVD process using the PECVD apparatus 10 was repeated under the same conditions as in the first growth, to carry out diamond growth for 15 hours (second growth). At the end of second growth, the product was taken out of the chamber 11. It was found that the diamond film had a thickness of 150 µm (growth rate of 5 µm/hr). A high growth rate was maintained in both the first and second growth steps.

The resulting single crystal diamond substrate was analyzed by Raman spectrometry, X-ray rocking curve, cross-sectional TEM, and CL. It was found to have good crystallinity and be free of defects.

Comparative Example 1

Diamond was produced under the same conditions as in Example 1 except that among the voltage applying conditions for diamond growth, only the DC voltage for diamond growth was applied and no reverse voltage pulse was applied.

At the end of first growth, the product was taken out of the chamber 11. It was found that diamond was grown to a thickness of 75 µm (growth rate of 5 µm/hr).

Thereafter, the DC plasma enhanced CVD process using the PECVD apparatus 10 was repeated under the same conditions as in the first growth, to carry out diamond growth for 15 hours (second growth). At the end of second growth, the product was taken out of the chamber 11. It was found that the diamond film had a thickness of 105 µm (growth rate of 2 µm/hr). The growth rate during the second growth step was dramatically low as compared with the first growth step. In addition, sparks occurred during the second growth step whereby the substrate was broken in part.

It has been demonstrated that the method for producing diamond according to the invention minimizes a drop of diamond growth rate due to charge buildup during growth and eliminates defect formation due to sparking. Thus diamond of quality can be produced at a high speed. Such diamond substrates may be used to manufacture high-frequency/high-power electronic devices of better performance in high yields.

Although a particular embodiment of the invention has been described in detail for purposes of illustration, various modifications and changes may be made without departing from the spirit and scope of the invention. Accordingly, the invention is not to be limited except as by the appended claims.

Japanese Patent Application No. 2012-174619 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for producing diamond, comprising a step of growing the diamond on a substrate from a gas mixture comprising at least a carbon-containing gas and hydrogen gas, by a DC plasma enhanced CVD process of applying a DC voltage between a stage electrode for holding the substrate and a voltage-applying electrode, wherein during the step of growing the diamond by continuously applying the DC voltage for the diamond growth between the stage electrode and the voltage-applying electrode, a pulse of reverse DC voltage against the DC voltage for the diamond growth is instantaneously stacked on the DC voltage for the diamond growth, whereby a single pulse voltage of opposite polarity to the DC voltage for diamond growth is applied between the stage electrode and the voltage-applying electrode at a predetermined timing.

2. The method of claim 1 wherein the DC voltage for the diamond growth is applied, such that the stage electrode is set at ground potential and made an anode and the voltage-applying electrode receives a voltage having a negative polarity potential relative to the stage electrode and is made a cathode.

3. The method of claim 1 wherein the single pulse voltage of opposite polarity is applied when a charging-up voltage between the stage electrode and the voltage-applying electrode reaches at least $\frac{1}{3}$ of the DC voltage for the diamond growth.

4. The method of claim 1 wherein the single pulse voltage of opposite polarity is applied at a constant periodicity of up to 1 pulse per 100 μs.

5. The method of claim 1 wherein the single pulse voltage of opposite polarity has a value which corresponds to the DC voltage for the diamond growth by a factor of $\frac{1}{30}$ to 1.

* * * * *